United States Patent
Hashimoto

(10) Patent No.: US 9,670,594 B2
(45) Date of Patent: Jun. 6, 2017

(54) GROUP III NITRIDE CRYSTALS, THEIR FABRICATION METHOD, AND METHOD OF FABRICATING BULK GROUP III NITRIDE CRYSTALS IN SUPERCRITICAL AMMONIA

(71) Applicants: SIXPOINT MATERIALS, INC., Buellton, CA (US); SEOUL SEMICONDUCTOR CO., LTD., Seoul (KR)

(72) Inventor: Tadao Hashimoto, Santa Barbara, CA (US)

(73) Assignee: SixPoint Materials, Inc., Buellton, CA (US)

( * ) Notice: Subject to any disclaimer, the term of this patent is extended or adjusted under 35 U.S.C. 154(b) by 60 days.

(21) Appl. No.: 14/957,536

(22) Filed: Dec. 2, 2015

(65) Prior Publication Data
US 2016/0153120 A1    Jun. 2, 2016

Related U.S. Application Data

(60) Provisional application No. 62/086,699, filed on Dec. 2, 2014.

(51) Int. Cl.
*C30B 29/40* (2006.01)
*C30B 25/02* (2006.01)
(Continued)

(52) U.S. Cl.
CPC ........ *C30B 29/406* (2013.01); *C01B 21/0632* (2013.01); *C30B 7/105* (2013.01);
(Continued)

(58) Field of Classification Search
None
See application file for complete search history.

(56) References Cited

U.S. PATENT DOCUMENTS 6,051,849 A  *  4/2000  Davis .................. H01L 21/0237
                                                    257/103
6,656,615 B2    12/2003  Dwiliński et al.
(Continued)

FOREIGN PATENT DOCUMENTS

CN      101962804 B    5/2012
WO   WO03/035945 A2    5/2003
(Continued)

OTHER PUBLICATIONS

PCT/US2015/063528 International Search Report and Written Opinion dated Feb. 24, 2016.

*Primary Examiner* — David Sample
*Assistant Examiner* — Donald M Flores, Jr.
(74) *Attorney, Agent, or Firm* — Strategic Innovation IP Law Offices, P.C.

(57) ABSTRACT

In one instance, the invention provides a group III nitride crystal having a first side exposing nitrogen polar c-plane of single crystalline or highly oriented polycrystalline group III nitride and a second side exposing group III polar surface, polycrystalline phase, or amorphous phase of group III nitride. Such structure is useful as a seed crystal for ammonothermal growth of bulk group III nitride crystals. The invention also discloses the method of fabricating such crystal. The invention also discloses the method of fabricating a bulk crystal of group III nitride by ammonothermal method using such crystal.

19 Claims, 2 Drawing Sheets

(51) Int. Cl.
*C30B 7/10* (2006.01)
*H01L 29/20* (2006.01)
*C01B 21/06* (2006.01)

(52) U.S. Cl.
CPC .......... *C30B 25/02* (2013.01); *H01L 29/2003* (2013.01); *C01P 2002/76* (2013.01); *C01P 2004/60* (2013.01); *Y02P 20/544* (2015.11)

(56) References Cited

U.S. PATENT DOCUMENTS

| | | |
|---|---|---|
| 7,078,731 B2 | 7/2006 | D'Evelyn et al. |
| 7,132,730 B2 | 11/2006 | Dwiliński et al. |
| 7,160,388 B2 | 1/2007 | Dwiliński et al. |
| 7,906,412 B2 * | 3/2011 | Oshima .................. C30B 25/00 257/E21.09 |
| 8,236,267 B2 | 8/2012 | Hashimoto et al. |
| 2004/0089221 A1 | 5/2004 | Dwiliński et al. |
| 2007/0234946 A1 * | 10/2007 | Hashimoto ............... C30B 7/10 117/71 |
| 2007/0252164 A1 * | 11/2007 | Zhong ............... H01L 21/02389 257/98 |
| 2009/0309105 A1 * | 12/2009 | Letts ......................... C30B 7/10 257/76 |
| 2011/0254134 A1 * | 10/2011 | Detchprohm ........... C30B 25/02 257/615 |
| 2012/0119218 A1 * | 5/2012 | Su .......................... C30B 25/18 257/76 |
| 2014/0087113 A1 | 3/2014 | Hashimoto et al. |
| 2016/0153115 A1 | 6/2016 | Hashimoto et al. |
| 2016/0153118 A1 | 6/2016 | Hashimoto et al. |

FOREIGN PATENT DOCUMENTS

| | | | |
|---|---|---|---|
| WO | WO 03035945 A2 * | 5/2003 | ............... C30B 7/00 |
| WO | WO2007/008198 A1 | 1/2007 | |
| WO | WO2007/117689 A2 | 10/2007 | |
| WO | WO2016/090045 A1 | 6/2016 | |

* cited by examiner

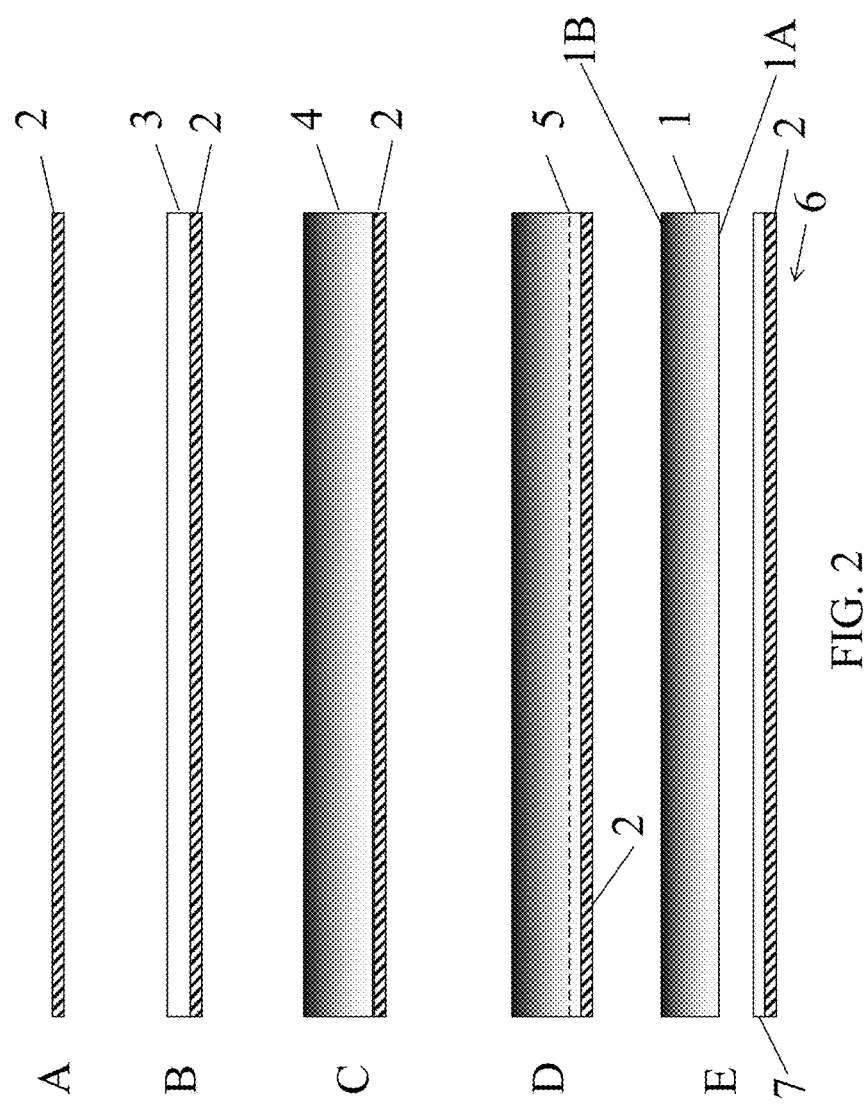

GROUP III NITRIDE CRYSTALS, THEIR FABRICATION METHOD, AND METHOD OF FABRICATING BULK GROUP III NITRIDE CRYSTALS IN SUPERCRITICAL AMMONIA

CROSS REFERENCE TO RELATED APPLICATIONS

This application claims the benefit of priority to U.S. application Ser. No. 62/086,699 entitled "Group III Nitride Crystals, Their Fabrication Method, and Method of Fabricating Crystals in Supercritical Ammonia," inventor Tadao Hashimoto, filed Dec. 2, 2014, the contents of which are incorporated by reference in their entirety herein.

This application is also related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility patent application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility patent application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility patent application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL," and issued as U.S. Pat. No. 8,236,237;

U.S. Utility patent application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility patent application Ser. No. 61/106,110, filed on Oct. 16, 2008, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility patent application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility patent application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

which applications are incorporated by reference herein in their entirety as if put forth in full below.

BACKGROUND

Field of the Invention

The invention relates to a substrate or a bulk crystal of semiconductor material used to produce semiconductor wafers for various devices including optoelectronic devices such as light emitting diodes (LEDs) and laser diodes (LDs), and electronic devices such as transistors. More specifically, the invention provides crystals of group III nitride such as gallium nitride. The invention also provides various methods of making these crystals.

Description of the Existing Technology

This document refers to several publications and patents as indicated with numbers within brackets, e.g., [x]. Following is a list of these publications and patents:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S. Nakamura, International Patent Application No. PCT/US2005/024239, WO07008198.

[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[6] D' Evelyn, U.S. Pat. No. 7,078,731.

Each of the references listed in this document is incorporated by reference in its entirety as if put forth in full herein, and particularly with respect to their description of methods of making and using group III nitride substrates.

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve fundamental problems caused by heteroepitaxy, it is indispensable to utilize crystalline group III nitride wafers sliced from bulk group III nitride crystal ingots. For the majority of devices, crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, the majority of commercially available GaN substrates are produced by a method called hydride vapor phase epitaxy (HVPE). HVPE is one of vapor phase methods, which has difficulty in reducing dislocation density less than $10^5$ cm$^{-2}$.

To obtain high-quality GaN substrates for which dislocation density is less than $10^5$ cm$^{-2}$, various growth methods such as ammonothermal growth, flux growth, high-temperature solution growth have been developed. Ammonothermal method grows group III nitride crystals in supercritical ammonia [1-6]. The flux method and the high-temperature solution growth use a melt of group III metal.

Recently, high-quality GaN substrates having dislocation density less than $10^5$ cm$^{-2}$ can be obtained by ammonothermal growth. Since the ammonothermal method can produce a true bulk crystal, one can grow one or more thick crystals and slice them to produce GaN wafers. In the ammonothermal growth, bulk crystals of GaN are grown on seed crystals. However, since GaN or other group III nitride crystals do not exist in nature, one must fabricate GaN seed crystal with other method.

It is difficult to grow a seed crystal quickly that is suitable for use in ammonothermal bulk growth. Most methods today rely on seeds taken from a crystal formed by ammonothermal growth. Seeds thick enough for use in ammonothermal growth that are produced by e.g. vapor phase epitaxy typically crack, especially on a nitrogen-polar face of a crystal (such as the c-plane face). Consequently, while people may have tried obtaining seeds for ammonothermal crystal growth by forming the seeds in a faster-growth method, people have met with limited success in producing seeds via a method in which crystals grow faster than in an ammonothermal process.

This invention discloses group III nitride crystal which may be used for seed crystals in the ammonothermal bulk growth. In addition, this invention discloses methods of fabricating group III nitride crystals, which may be used for seed crystals in the ammonothermal bulk growth. Also this invention discloses a method of growing bulk crystals of group III nitride in supercritical ammonia using the group III nitride crystals as seeds.

SUMMARY OF THE INVENTION

In one instance, the invention provides a wafer or other substrate of group III nitride having a first, nitrogen-polar c-plane side and a second side opposite to the first side. The first side has an exposed nitrogen-polar face of single crystalline or highly oriented polycrystalline group III nitride. The second side has either a group III polar, c-plane face of polycrystalline phase or amorphous phase of group III nitride. The structural quality of the group III nitride is highest on the first side and gradually degrades towards the second side. The structural degradation from the first side to the second side can therefore be gradual and continual. With this structure, the first side is free of crystal cracks.

In some instances, a wafer or crystal as disclosed herein has a first, nitrogen-polar face that is single-crystal group III nitride and a second face that is oriented polycrystalline group III nitride, unoriented polycrystalline group III nitride, amorphous group III nitride, or a mixture of these. In some other instances, a wafer or crystal as disclosed herein has a first, nitrogen-polar face that is oriented polycrystalline group III nitride and a second face that is unoriented polycrystalline group III nitride, amorphous group III nitride, or a mixture of these. In any event, the second face has poorer structural quality than the first face of the wafer or crystal so that the wafer or crystal has sufficiently low stress within it that the resulting wafer or crystal does not crack on its first, nitrogen-polar face.

The invention also provides methods of fabricating group III nitride crystal explained above. Using an epitaxial growth method such as HVPE, group III nitride crystal is grown on a substrate with group III polar face exposed. By changing growth condition such as temperature and/or ambient oxygen concentration during the growth, the structural quality is degraded gradually and preferably continually through growth. The grown group III nitride crystal on the substrate may split into two wafers upon cooling inside the epitaxial growth reactor, after cooling inside the epitaxial growth reactor, or outside of the epitaxial growth reactor. One of the split wafers has a first side exposing nitrogen polar c-plane and a second side exposing group III polar c-plane, polycrystalline phase or amorphous phase of group III nitride.

In addition, the invention provides methods of growing bulk crystal of group III nitride such as gallium nitride using the group III nitride crystal explained above in supercritical ammonia.

BRIEF DESCRIPTION OF THE DRAWINGS

Referring now to the drawings in which like reference numbers represent corresponding parts throughout.

In the figure each number represents the followings.

Figure 1:
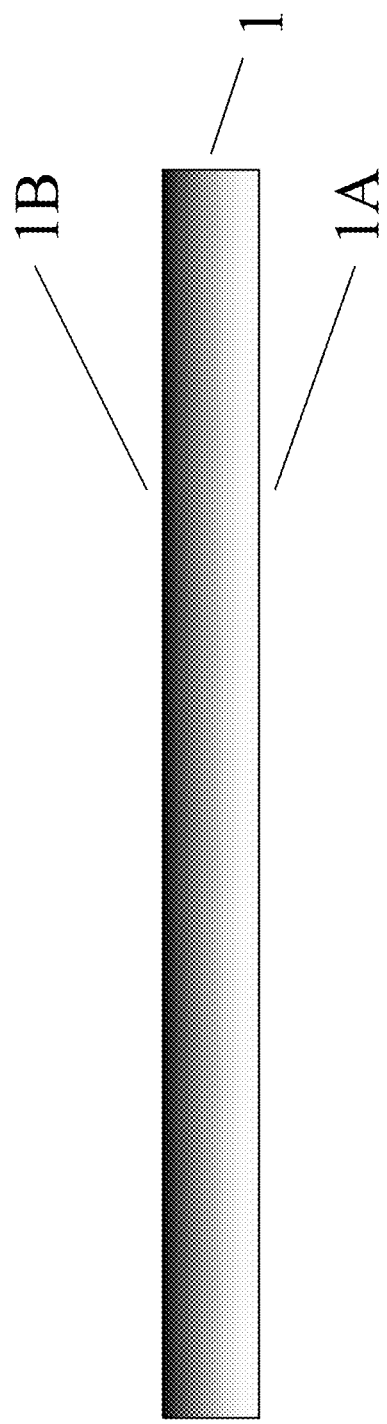
FIG. 1 is a schematic drawing of the group III nitride crystal.

1. A group III nitride crystal,

1A. A first side of the crystal exposing nitrogen polar c-plane surface,

1B. A second side opposite to the first side/

FIG. 2 is a schematic drawing of group III nitride and substrate depicted at steps A-E during fabrication of the group III nitride crystal.

In the figure each number represents the followings:

2. A substrate,

3. A group III nitride grown on a substrate,

4. A group III nitride grown with changing growth parameter so that the structural quality degrades gradually and continually along the growth direction.

5. A location of separation that can occur upon or after cooling,

6. One of the split wafers which contains the substrate.

7. A group III nitride layer remaining on a substrate 2 after a group III nitride wafer 6 has separated from the substrate.

DETAILED DESCRIPTION OF THE INVENTION

Overview

The group III nitride crystal of the present invention is typically used as a seed crystal for ammonothermal bulk growth. The group III nitride is typically GaN although it can be any solid solution of group III nitride expressed as $Ga_xAl_yIn_{1-x-y}N$ ($0 \leq x \leq 1$, $0 \leq x+y \leq 1$). The group III nitride crystal has a first side exposing nitrogen polar surface of c-plane and a second side exposing either group III polar (e.g. Ga polar in the case of GaN) surface of c-plane, polycrystalline phase, or amorphous phase of group III nitride. The group III nitride crystal has a high structural-quality nitrogen polar first face and poorer structural-quality second face. With this structure, one can eliminate cracks exposed on the first side of the crystal.

The structural quality of the first side is higher than that of the second side. "Structural quality" means how perfect the atomic arrangement is within the bulk crystal (the overall uniformity of the crystal lattice's unit cell across a plane of the bulk crystal, where the plane is parallel to the surface of the substrate on which the bulk crystal is grown), which can be evaluated with X-ray rocking curve or other analytical methods. If it is evaluated with X-ray rocking curve, the FWHM of the rocking curve of 002 reflection is smaller for the first side than the second side. The characteristics of the group III nitride crystal explained here may be suitable for usage as seed crystals in the ammonothermal bulk growth.

To fabricate group III nitride crystals explained above, one can use epitaxial growth method such as HVPE. Other methods like metalorganic chemical vapor deposition (MOCVD), molecular beam epitaxy (MBE), flux method, high-pressure solution growth, sputtering can also be used as long as the method is compatible with a heterogeneous substrate such as sapphire, silicon carbide, silicon and gallium arsenide.

The structural quality is degraded along the growth direction by changing growth conditions as more group III nitride is deposited on a substrate. The growth conditions are changed to degrade structural quality gradually (i.e. the unit cell is made less uniform or perfect in new growth as growth proceeds as shown by e.g. XRD results) so that the group III nitride has high-quality in a plane parallel to the surface of the substrate but poorer quality in a plane farther away from the substrate. The structural quality may be continually degraded from the high quality plane to the plane farther from the substrate. The change may be e.g. linear, exponential, or other continuous function. The structural quality may alternatively be progressively changed, step by step, preferably by small amounts. A sufficient amount of the group III nitride is deposited on the substrate to form a wafer of group III nitride that can be used in subsequent ammonothermal growth using that wafer. The quality is degraded at a rate that provides high-quality group III nitride at or near a separation point from the substrate (where the first face of the separated wafer will be) but sufficiently poor quality at the second face that the bulk group III nitride of the wafer has low stress. The low amount of stress prevents the first, nitrogen-polar face from cracking when the wafer is separated from the substrate on which the wafer was grown but still provides a wafer which is suitable for use in an ammonothermal method of growing high-quality group III nitride on its first, nitrogen-polar face. The resultant group III nitride crystal is therefore one that has a high structural quality, nitrogen-polar first face and a poorer structural quality second face with lower stress than a comparative crystal formed by maintaining crystal growth conditions constant during crystal growth or adjusting conditions to improve structural quality of new growth. The resultant crystal is also thick enough for use as a seed in a subsequent ammonothermal growth of group III nitride on its first, nitrogen-polar face. Growth temperature and/or concentration of impurity such as oxygen in the ambient gas can be changed during growth to degrade crystal quality. For instance, growth temperature can be decreased during group III nitride growth to reduce crystal quality of the group III polar face. Alternatively or additionally, oxygen concentration in the ambient during growth may be increased to reduce crystal quality of the group III polar face. The growth conditions can be changed continually to degrade crystal quality farther from the substrate. The change may be e.g. linear, exponential, or other continuous function, such as by decreasing the temperature linearly or increasing oxygen concentration in the ambient linearly. The change in growth conditions may alternatively be progressively changed, step by step, preferably by small amounts. The resulting group III nitride substrate can therefore have good crystal quality on a nitrogen-polar face, lower stress in the group III nitride, and poorer crystal quality at a group III polar face of the substrate.

After growth on the heterogeneous substrate has finished, upon or after cooling, the grown group III nitride crystal on the substrate may sometimes split into two pieces (we call this as self-separation) possibly due to the graded structure, difference in thermal expansion between the substrate and group III nitride, and/or difference in lattice constant between the substrate and group III nitride. Self-separation often occurs in new group III nitride that was deposited on group III nitride layer 7 of FIG. 2 when a heterogeneous substrate is used to make a crystal or wafer, such that group III nitride layer 7 is thicker than group III nitride layer 3 on substrate 2. Layer 7 in this instance may include group III nitride layer 3 that was originally deposited on substrate 2 as well as a portion of new group III nitride grown on layer 3. If self-separation does not occur one can use a conventional removal method such as grinding or laser lift-off to remove the substrate.

The group III crystal explained above is suitable as a seed for ammonothermal bulk GaN growth. Using an ammonothermal method such as one disclosed in the U.S. Utility patent application Ser. No. 61/058,910 (now U.S. Pat. No. 8,236,237), bulk crystal of group III nitride may be grown on the group III crystal. Due to crack-free surface and higher structural quality on the first side, bulk crystal grown on such seeds show good crystal quality.

Technical Description of the Invention

The schematic of the group III nitride crystal in this invention is presented in FIG. 1. The group III nitride crystal has a first side (1A) exposing nitrogen polar c-plane of group III nitride with a miscut angle less than +/−5 degree. The crystal has a second side (1B) opposite to the first side which exposes either group III polar c-plane, polycrystalline phase or amorphous phase of group III nitride.

The first side is single crystalline or highly oriented polycrystalline group III nitride and the second side is single crystalline, polycrystalline, or amorphous group III nitride. The structural quality on the first side is higher than that on the second side. Here the structural quality means perfection of atomic arrangement in the crystal and is typically characterized with X-ray diffraction or other analytical methods. In the case of X-ray diffraction, FWHM of X-ray rocking curve from 002 reflection is recorded from both sides. The FWHM from the first side is smaller than that from the second side. The FWHM from the first side is typically smaller than 1000 arcsec, preferably less than 500 arcsec, and more preferably less than 200 arcsec. The FWHM from the second side is typically more than 500 arcsec, preferably 1000 arcsec. If the second surface is either polycrystalline phase or amorphous phase, one cannot detect 002 peak in the X-ray. This mean that the structural quality is poor. Even if other analytical methods are used, the crystal quality on the first side shows higher than that on the second side. The change in the structural quality from the first side to the second side is preferably gradual and may also be progressive or continual.

The non-uniform structural quality along the c-axis direction helps to eliminate cracks on the first side because the low-quality crystal underneath the first side acts as a buffer to reduce residual stress in the crystal.

The thickness of the group III nitride crystal is typically more than 0.1 mm to maintain its shape, preferably more than 0.3 mm, and more preferably between 0.4 to 1 mm.

As explained later, the group III nitride crystal can be fabricated with an epitaxial growth method like HVPE. Other methods such as MOCVD, MBE, a flux method, high-pressure solution growth or sputtering can be used as long as these methods are compatible with heterogeneous substrates such as sapphire, silicon carbide, silicon and gallium arsenide.

High structural quality and crack-free characteristic on the first side (i.e. nitrogen polar c-plane surface) is beneficial to the ammonothermal bulk growth because a bulk group III nitride crystal is typically grown on the nitrogen polar c-plane in this method. When the group III nitride crystal in this invention is used as a seed crystal in the ammonothermal growth, the first surface is preferably lapped and polished for high level of flatness and appropriate atomic arrangement on the surface. The first side is optionally polished with chemical mechanical polishing to obtain atomically flat surface and remove subsurface damage caused by the prior process. By covering the second side of the crystal with another seed (the second side attached together so that the sides with poor crystal quality face one another) or other masking material (such as silver foil, nickel foil, vanadium foil or other metal foils), high-quality bulk crystal of group III nitride can be obtained on the first side of the group III nitride crystal.

To fabricate the group III nitride crystal explained above, an epitaxial growth of group III nitride is conducted on a substrate preferably with HVPE. The substrate may be heterogeneous substrate such as sapphire, silicon carbide, silicon or gallium arsenide, or homogeneous substrate such as GaN, AlN, InN or their solid solutions. Other epitaxial growth method such as MOCVD, MBE, a flux method, high-pressure solution growth or sputtering can be used as long as these methods are compatible with heterogeneous substrates such as sapphire, silicon carbide, silicon and gallium arsenide.

FIG. 2 shows a particular sequence of process steps in a method according to this invention. FIG. 2A shows a substrate 2 before growing group III nitride. In an epitaxial growth reactor such as HVPE reactor, single crystalline or highly oriented polycrystalline group III nitride layer 3 is grown. The growth temperature is typically between 950 and 1150° C. After this step, the growth condition such as temperature is gradually decreased and/or concentration of impurity in ambient gas is gradually increased to deteriorate the structural quality gradually to form the group III nitride crystal layer 4. The gradual change in structural quality is depicted by the crystal color darkening in the direction of growth. After growth is finished, the group III nitride crystal on the substrate is cooled. During or after the cooling process the group III nitride crystal may crack along a horizontal line 5, resulting in splitting into two wafers. One wafer 6 contains the substrate and the other wafer is the group III nitride crystal in this invention. We call this splitting as self-separation.

If self-separation does not occur, one can remove the substrate with conventional methods such as mechanical grinding and laser lift-off. After removal of the substrate, one obtains a group III nitride crystal in this invention.

This group III nitride crystal can be used as a seed crystal in the ammonothermal growth of bulk GaN. As disclosed in the U.S. Utility patent application Ser. No. 61/058,910 (now U.S. Pat. No. 8,236,237), for example, seed crystals, mineralizer such as sodium metal, flow restricting devices such a baffles, gallium containing nutrient such as polycrystalline GaN and ammonia is loaded in a high-pressure reactor. The inside of the high-pressure reactor is divided into at least two regions namely a seed region and a nutrient region. In the case of ammonobasic condition (i.e. using alkali metal or alkali earth metal as a mineralizer), the seed region is located below the nutrient region. The baffles separate these two regions. The high-pressure reactor is heated so that the appropriate temperature difference is made to grow group III nitride.

In the case of ammonobasic growth of GaN, bulk GaN crystal typically shows better quality on nitrogen face than on gallium face. Therefore, the group III nitride crystal in this invention is beneficial to the ammonothermal growth. By covering the group III polar side of the crystal, we can grow high-quality GaN crystal selectively on the nitrogen polar side. There are a few ways of masking the group III polar face. One way is to attach two seeds together on group III polar sides to make one hybrid seed exposing nitrogen polar surface on the both sides. The other way is to mount the seed crystal on a metal plate such as vanadium, nickel, silver, and nickel-chromium alloys with nitrogen polar facing up. After the ammonothermal growth, bulk GaN crystal is obtained on the nitrogen side of the group III nitride crystal.

Example 1 (Growth Number 0858)

GaN crystal was grown by HVPE. 2" c-plane sapphire substrate having GaN layer grown by MOCVD was loaded in an HVPE reactor. After ramping the substrate temperature to about 1000° C. under constant flow of ammonia and nitrogen, gallium chloride gas was introduced to grow single crystalline GaN. After three hours of growth, the growth temperature was gradually reduced over 13 hours. The temperature was reduced linearly by 100° C. over 13 hours, resulting in a temperature reduction rate of 100° C. per 13 hours. After growing total 16 hours (3 hours of constant temperature and 13 hours of graded temperature), the supply of gallium chloride was stopped and the furnace was turned off. At about 800° C., the ammonia supply was stopped. The GaN crystal was cooled in the reactor until the temperature reaches about 300° C. When the crystal was taken out of the reactor, the GaN crystal was self-separated from the substrate portion.

Since the substrate portion has a layer of GaN, the self-separation occurred somewhere inside the GaN crystal. The thickness of c-plane sapphire was 0.45 mm, the thickness of the portion containing the sapphire was 0.89 mm, the thickness of the GaN crystal separated from the substrate was 1.78 mm. The first side of the GaN crystal showed clear color whereas the second side of the GaN crystal showed grayish/blackish color. The clear GaN crystal contains oxygen of less than about $10^{17}$ cm$^{-3}$ whereas the grayish/blackish GaN contains oxygen of more than about $10^{19}$ cm$^{-3}$. The X-ray measurement showed 002 peak from the first side (nitrogen polar side) but no peak from the second side. This means that the second side surface is covered with either polycrystalline or amorphous GaN. The first side was free of cracks. The miscut angle measured with X-ray rocking curve was within +/−5 degree.

Example 2 (Grinding/Lapping of the Crystal)

Both sides of the GaN crystal were ground with a diamond grinder to obtain a GaN wafer having a thickness of 1.1 mm. The FWHM of X-ray rocking curve from the first side was 1382 arcsec whereas the second side did not show a 002 peak. Then, both sides of the GaN crystal wafer were further ground and lapped with diamond slurry. The total thickness became 0.85 mm with Ra roughness on the nitrogen side of 0.5~0.8 nm and Ra roughness on the gallium side of 0.8~1.2 nm. The FWHM of the X-ray rocking curve from the first side improved to 1253 arcsec. The first side did not have any crack.

Example 3 (Ammonothermal Growth Using the Obtained GaN Crystal)

The GaN crystal wafer obtained in Example 2 was used as a seed crystal for ammonothermal bulk growth. A high-pressure reactor was filled with the seed, sodium metal, baffles, polycrystalline GaN nutrient and ammonia. Then, the high-pressure reactor was tightly sealed and heated to about 550° C. After 11 days of growth, a bulk GaN crystal having thickness of about 2.07 mm was obtained. The FWHM of the X-ray rocking curve from the first side improved to 1048 arcsec. The crystal also did not have crack.

Example 4 (Growth Number 0895)

Similar to example 1, a GaN crystal was grown by HVPE. 2" A c-plane sapphire substrate having a GaN layer grown by MOCVD was loaded in a HVPE reactor. Although the growth conditions and duration were the same as Example 1, the substrate and new crystal did not completely separate. The thickness excluding the sapphire substrate portion was 2.63 mm. The FWHM of the X-ray rocking curve from 002 reflection on the first side was about 925 arcsec, whereas the FWHM on the second side was 1580 arcsec. In this case the Ga polar side had low-quality crystalline GaN (i.e. highly oriented polycrystalline) on the exposed second face. The residual sapphire substrate was removed with a diamond grinder, and then both sides of the GaN crystal were also ground to obtain a wafer of 0.44 mm thickness.

Advantages and Improvements

The group III nitride crystal of this invention has higher structural quality on the nitrogen polar surface and is free of cracks. Such crystal is suitable for a seed crystal in the ammonothermal bulk growth. A method of fabricating the group III nitride crystal in this invention uses epitaxial growth of group III nitride on a substrate, followed by self-separation or removal of the substrate. By changing growth conditions gradually during crystal growth, the structural quality is deteriorated gradually, thus avoiding crack generation on the first side of the crystal. By using such crystals for ammonothermal bulk growth, one can obtain high-quality bulk crystals of group III nitride such as GaN.

Possible Modifications

Although the example describes crystals of GaN, similar benefit of this invention can be expected for other group III nitride alloys of various compositions, such as AlN, AlGaN, InN, InGaN, or GaAlInN.

Although the preferred embodiment describes HVPE as an epitaxial growth method, other methods such as MOCVD, MBE, a flux method, high-pressure solution growth or sputtering can be used as long as they are compatible with heterogeneous substrates.

Although the preferred embodiment describes a seed crystal having a diameter of 2", similar benefit of this invention is expected for a larger diameter such as 4", 6" and larger.

Although the preferred embodiment describes X-ray characterization of structural quality, other methods such as Rutherford backscattering (RBS), reflection high-energy electron diffraction (RHEED), transmission electron microscopy (TEM) can be used to evaluate the structural quality of the surfaces.

Although the example describes a diamond grinding to remove the sapphire substrate, laser lift-off or other methods can be used to remove the substrate.

It is not necessary to start the method using a heterogeneous substrate that has a group III nitride material deposited upon it. One can start with a substrate and immediately begin forming group III nitride upon that substrate under conditions that produce high structural-quality group III nitride and then adjust deposition conditions to gradually form poorer structural-quality group III nitride as further group III nitride deposition occurs. Further, it is not necessary to start with a heterogeneous substrate. One may utilize a group III nitride substrate and grow on a group III polar face of the substrate, forming high-quality group III nitride, and then change growth conditions to gradually form poorer-quality group III nitride in subsequent growth.

Following are various examples of processes, machines, articles of manufacture, and/or compositions of matter that illustrate certain embodiments of but do not limit the scope of the claimed invention:

1. A group III nitride crystal comprising,
   (a) a first side having an exposed nitrogen polar c-plane surface with miscut angle less than +/−5 degree.
   (b) a second side opposite to the first side having an exposed group III polar c-plane surface, polycrystalline phase or amorphous phase of the group III nitride,
   wherein crystal structural quality of the first side is better than crystal structural quality of the second side.
2. A group III nitride crystal according to paragraph 1, wherein the surface of the first side is free from cracking.
3. A group III nitride crystal according to paragraph 1 or paragraph 2, wherein crystal quality degrades gradually from the first side to the second side of the group III nitride crystal.
4. A group III nitride crystal according to any one of paragraphs 1 through 3, wherein the oxygen concentration on the first side is smaller than the oxygen concentration of the second side.
5. A group III nitride crystal according to paragraph 4 wherein the oxygen concentration of the second side is more than ten times higher than the oxygen concentration of the first side.
6. A group III nitride crystal according to any one of paragraphs 1 through 5, wherein the full width half maximum of X-ray rocking curve of the 002 reflection from the first side is smaller than the full width half maximum of X-ray rocking curve of the 002 reflection from the second side.

7. A group III nitride crystal according to paragraph 6 wherein the FWHM of the X-ray rocking curve of the 002 reflection from the first side is less than 1000 arcsec.
8. A group III nitride crystal according to paragraph 7 wherein the FWHM of the X-ray rocking curve of the 002 reflection from the first side is less than 500 arcsec.
9. A group III nitride crystal according to paragraph 8 wherein the FWHM of the X-ray rocking curve of the 002 reflection from the second side is greater than 500 arcsec.
10. A group III nitride crystal according to any one of paragraphs 6-8 wherein the FWHM of the X-ray rocking curve of the 002 reflection from the second side is greater than 1000 arcsec.
11. A group III nitride crystal according to any one of paragraphs 1 through 6, wherein the thickness of the crystal is more than 0.1 mm.
12. A group III nitride crystal according to paragraph 11 wherein the crystal is more than 0.5 mm thick.
13. A group III nitride crystal according to paragraph 11 wherein the crystal is more than 1 mm thick.
14. A group III nitride crystal according to any one of paragraphs 1 through 13, wherein the first side is polished sufficiently that the first side is suitable for ammonothermal growth of a bulk crystal.
15. A group III nitride crystal according to any one of paragraphs 1 through 14, wherein the crystal is fabricated by hydride vapor phase epitaxy.
16. A group III nitride crystal according to any one of paragraphs 1 through 15, wherein the transition of crystal quality from the first side to the second side is continuous.
17. A group III nitride crystal according to any one of paragraphs 1 through 16, wherein the group III nitride is GaN.
18. A group III nitride crystal according to any one of paragraphs 1 through 17 wherein the crystal has no cracks throughout the crystal.
19. A group III nitride wafer of a crystal of any one of paragraphs 1 through 18.
20. A group III nitride wafer according to paragraph 19 wherein the wafer is a single crystal group III nitride wafer.
21. A method of fabricating a group III nitride crystal comprising;
   (a) growing a single crystalline or a highly oriented polycrystalline group III nitride layer on a substrate, wherein the exposed surface of the layer is group III polar c-plane;
   (b) further growing single crystalline or highly oriented polycrystalline group III nitride having gradually degraded crystal structure such that the exposed surface of the crystal becomes a group III polar c-plane, polycrystalline phase or amorphous phase;
   (c) removing the substrate to obtain a crystal having a first nitrogen polar c-plane surface and a second group III polar c-plane surface, polycrystalline phase or amorphous phase of the group III nitride.
22. A method of fabricating a group III nitride crystal according to paragraph 21, wherein steps (a) and (b) are conducted with hydride vapor phase epitaxy.
23. A method of fabricating a group III nitride crystal according to paragraph 21 or 22, wherein the substrate is a heterogeneous substrate.
24. A method of fabricating a group III nitride crystal according to any one of paragraphs 21 through 23, wherein the step (c) comprises self-separation of the substrate upon or after cooling.
25. A method of fabricating a group III nitride crystal according to any one of paragraphs 21 through 23 wherein the step (c) comprises grinding of the substrate.
26. A method of fabricating a group III nitride crystal according to any one of paragraphs 21 through 23 wherein the step (c) comprises laser lift-off of the substrate.
27. A method of fabricating a group III nitride crystal according to any one of paragraphs 21 through 26, wherein the step (b) is conducted at lower temperature than that of step (a).
28. A method of fabricating a group III nitride crystal according to paragraph 27, wherein the temperature in the step (b) is gradually decreased during growth.
29. A method of fabricating a group III nitride crystal according to paragraph 28, wherein the temperature in the step (b) is decreased linearly during growth.
30. A method of fabricating a group III nitride crystal according to according to any one of paragraphs 21 through 29, wherein the step (b) is conducted at higher oxygen concentration than that of step (a).
31. A method of fabricating a group III nitride crystal according to paragraph 30, wherein the oxygen concentration in the step (b) is gradually increased during growth.
32. A method of fabricating a group III nitride crystal according to paragraph 31, wherein the oxygen concentration is increased linearly.
33. A method of fabricating a group III nitride crystal according to any one of paragraphs 21 through 32, further comprising the following steps;
   (a) grinding the second surface;
   (b) grinding the first surface;
   (c) lapping the first surface.
34. A method of fabricating a group III nitride crystal according to any one of paragraphs 21 through 33, wherein the group III nitride is GaN.
35. A group III nitride crystal formed by a method of any one of paragraphs 21 through 34.
36. A method of fabricating a bulk crystal of group III nitride in supercritical ammonia using a group III nitride crystal according to any one of paragraphs 1 through 19 and 35 as a seed crystal in the supercritical ammonia.
37. A method according to any one of paragraphs 21 through 34 and 36, wherein the group III nitride is GaN.
38. A method of fabricating a bulk crystal of gallium nitride in a high-pressure reactor comprising
   (a) placing at least one gallium nitride seed crystal in the high pressure reactor;
   (b) placing at least one kind of mineralizer in the high pressure reactor;
   (c) placing at least one flow-restricting plate in the high pressure reactor
   (d) placing gallium containing nutrient in the high pressure reactor;
   (e) placing ammonia in the high pressure reactor;
   (f) sealing the high pressure reactor;
   (g) heating the high pressure reactor with appropriate temperature difference between the region for the seed crystals and the region for the nutrient;
   wherein the crystal structural quality of the nitrogen polar surface of the gallium nitride seed crystal is better than the crystal structural quality of the gallium polar surface of the seed crystal.
39. A method of fabricating a bulk crystal of gallium nitride according to paragraph 38, wherein the nitrogen polar surface of the gallium nitride seed crystal is free from cracking.
40. A method of fabricating a bulk crystal of gallium nitride according to paragraph 38 or paragraph 39, wherein the oxygen concentration of the nitrogen polar surface of the gallium nitride seed crystal is less than the oxygen concentration of the gallium polar surface.
41. A method of fabricating a bulk crystal of gallium nitride according to paragraph 40 wherein the oxygen concentration of the gallium polar surface is more than ten times higher than the oxygen concentration of the opposite side.
42. A method of fabricating a bulk crystal of gallium nitride according to paragraph 38 and 39, wherein the full width half maximum of X-ray rocking curve of the 002 reflection from the nitrogen polar surface of the gallium nitride seed crystal is smaller than the full width half maximum of X-ray rocking curve of the 002 reflection from the opposite side.
43. A method of fabricating a bulk crystal of gallium nitride according to any one of paragraphs 38 through 42, wherein the thickness of the gallium nitride seed crystal is more than 0.1 mm.
44. A method according to paragraph 43 wherein the thickness of the gallium nitride seed crystal is at least 0.5 mm.
45. A method of fabricating a bulk crystal of gallium nitride according to any one of paragraphs 38 through 43, wherein the nitrogen polar surface of the gallium nitride seed crystal is polished to obtain a suitable surface for ammonothermal growth of bulk crystal.
46. A method of fabricating a bulk crystal of gallium nitride according to any one of paragraphs 38 through 45, wherein the gallium nitride seed crystal is fabricated by hydride vapor phase epitaxy.
47. A method of fabricating a bulk crystal of gallium nitride according to any one of paragraphs 38 through 46, wherein the transition of crystal quality from the nitrogen polar surface of the gallium nitride seed crystal to the opposite side is gradual.

Variations on these and other embodiments as disclosed herein are recognizable by one skilled in the art, and these variations are also within the scope of the invention disclosed herein. Consequently, the claims are to be accorded a broad interpretation, consistent with the disclosure of the new technology and principles disclosed herein.

What is claimed is:
1. A group III nitride crystal comprising:
   (a) a first side having an exposed nitrogen polar c-plane surface with miscut angle within +/−5 degree;
   (b) a second side opposite to the first side having an exposed group III polar c-plane surface, polycrystalline phase or amorphous phase of the group III nitride;
   wherein crystal structural quality of the first side is better than crystal structural quality of the second side; and
   wherein the crystal quality degrades gradually from the first side to the second side of the group III nitride crystal.
2. A group III nitride crystal according to claim 1, wherein the surface of the first side is free from cracking.
3. A group III nitride crystal according to claim 1, wherein oxygen concentration of the first side is smaller than oxygen concentration of the second side.
4. A group III nitride crystal according to claim 3, wherein the oxygen concentration of the second side is more than ten times higher than the oxygen concentration of the first side.
5. A group III nitride crystal according to claim 1, wherein a full width half maximum (FHWM) of X-ray rocking curve of 002 reflection from the first side is smaller than a full width half maximum of X-ray rocking curve of 002 reflection from the second side.
6. A group III nitride crystal according to claim 5, wherein the FWHM of the X-ray rocking curve of the 002 reflection from the first side is less than 1000 arcsec.
7. A group III nitride crystal according to claim 6, wherein the FWHM of the X-ray rocking curve of the 002 reflection from the first side is less than 500 arcsec.
8. A group III nitride crystal according to claim 7, wherein the FWHM of the X-ray rocking curve of the 002 reflection from the second side is greater than 500 arcsec.
9. A group III nitride crystal according to claim 6, wherein the FWHM of the X-ray rocking curve of the 002 reflection from the second side is greater than 1000 arcsec.
10. A group III nitride crystal according to claim 1, wherein the crystal has a thickness of more than 0.1 mm.
11. A group III nitride crystal according to claim 10, wherein the thickness is more than 0.5 mm.
12. A group III nitride crystal according to claim 10, wherein the thickness is more than 1 mm.
13. A group III nitride crystal according to claim 1, wherein the first side is polished sufficiently that the first side is suitable for ammonothermal growth of a bulk crystal.
14. A group III nitride crystal according to claim 1, wherein the crystal is fabricated by hydride vapor phase epitaxy.
15. A group III nitride crystal according to claim 1, wherein transition of crystal quality from the first side to the second side is continuous.
16. A group III nitride crystal according to claim 1, wherein the group III nitride is GaN.
17. A group III nitride crystal according to claim 1, wherein the crystal has no cracks throughout the crystal.
18. A group III nitride wafer of a crystal of claim 1.
19. A group III nitride wafer according to claim 18, wherein the wafer is a single crystal group III nitride wafer.

* * * * *